United States Patent
Kondo et al.

[11] Patent Number: 5,994,822
[45] Date of Patent: Nov. 30, 1999

[54] PIEZOELECTRIC DEVICE AND METHOD FOR FABRICATING THE SAME

[75] Inventors: Masao Kondo; Mineharu Tsukada; Masaharu Hida, all of Kawasaki, Japan

[73] Assignee: Fujitsu Limited, Kawasaki, Japan

[21] Appl. No.: 09/023,417

[22] Filed: Feb. 13, 1998

[30] Foreign Application Priority Data

May 27, 1997 [JP] Japan ................................. 9-137221

[51] Int. Cl.$^6$ ................................................ H01L 41/193
[52] U.S. Cl. ................................................................. 310/358
[58] Field of Search .............................................. 310/358

[56] References Cited

U.S. PATENT DOCUMENTS

| | | | |
|---|---|---|---|
| 4,675,123 | 6/1987 | Tsunooka et al. | 252/62.9 |
| 4,917,810 | 4/1990 | Tsunooka et al. | 252/62.9 |
| 5,169,551 | 12/1992 | Tsunooka et al. | 252/62.9 |
| 5,221,872 | 6/1993 | Nishida et al. | 310/358 |
| 5,607,614 | 3/1997 | Kawano et al. | 252/62.9 PZ |
| 5,668,071 | 9/1997 | Kashiwaya et al. | 501/136 |
| 5,792,569 | 8/1998 | Sun et al. | 428/692 |

*Primary Examiner*—Thomas M. Dougherty
*Attorney, Agent, or Firm*—Armstrong, Westerman, Hattori, McLeland & Naughton

[57] ABSTRACT

A number of single crystal domains having crystal orientations different from each other cohere to form one grain, and a number of grains cohere to form a piezoelectric material. When a grain has a size exceeding a certain size, cracks take place in the surface of the grain. Because of generation of the cracks constraining forces from adjacent domains are weak, and a displacement which is substantially the same as a displacement ideal to piezoelectric material can be obtained.

8 Claims, 17 Drawing Sheets

1 μm

SINGLE CRYSTAL PIEZOELECTRIC ELEMENT
DISPLACEMENT AMOUNT:MAXIMUM

CONVENTIONAL PIEZOELECTRIC ELEMENT
DISPLACEMENT AMOUNT:SMALL

PIEZOELECTRIC ELEMENT OF THIS INVENTION
DISPLACEMENT AMOUNT:LARGE

PIEZOELECTRIC DEVICE AND METHOD FOR FABRICATING THE SAME

BACKGROUND OF THE INVENTION

The present invention relates to a piezoelectric device using a piezoelectric material, more specifically to a piezoelectric device for use in a head of an ink jet printer, actuator or others, and a method for fabricating the same.

As a piezoelectric device used in a head of an ink jet printer, actuator or others, a piezoelectric device having a high achievement of providing high displacement with low voltage charge is required. To fabricate a piezoelectric device of such high achievement it is necessary to produce raw material powder which is able to be sintered sufficiently to exhibit high piezoelectric characteristics before sintered.

To produce piezoelectric raw material of high achievement, piezoelectric characteristics have been improved conventionally by mixing respective raw materials, repeating pre-sintering several times to obtain a higher ratio of perovskite phase, which exhibits high piezoelectric characteristics.

For piezoelectric characteristics improvement, various materials, such as $Fe_2O_3$, $Al_2O_3$, $Bi_2O_3$, $MnO_2$, etc. are added.

Although piezoelectric characteristics are thus improved, the side of apparatuses, such as ink jet printers, etc., which use piezoelectric devices requires piezoelectric devices of higher achievements.

Conventionally alumina balls have been used as a mixing medium, and the alumina balls are abraded, and the alumina often mix into the raw materials to resultantly deteriorate piezoelectric characteristics.

Conventionally water or alcohol is used as a solvent for mixing respective raw materials, and when the mixed powder is recovered, the respective raw material powders which have been mixed are separated due to sedimentation with a result that sintered piezoelectric ceramics often has an inhomogeneous composition. Due to the inhomogeneous composition, pyrochlore phase, which exhibit no piezoelectric characteristics, is produced, which results in reduced piezoelectric achievement.

Addition of various material results in improved piezoelectric characteristics, but when they are added in large amounts, the added materials are segregated in grain boundaries with results that ceramics is not sufficiently sintered and has low sintering density. Sufficient piezoelectric characteristics cannot be realized.

SUMMARY OF THE INVENTION

An object of the present invention is to provide a piezoelectric device having piezoelectric characteristics of high achievement, and a method for fabricating the piezoelectric device.

The above-described object is achieved by a piezoelectric device of a piezoelectric material including a grain having a plurality of cohering domains, the grain having an average grain diameter of about 2 μm or more; the domain having an average diameter of about 0.1 μm or more; and cracks being formed between the domains, whereby constraining forces from adjacent grains are weak, and a displacement which is substantially the same as a displacement intrinsic to the piezoelectric material.

In the above-described piezoelectric device it is preferable that the piezoelectric material having a perovskite structure.

In the above-described piezoelectric device it is preferable that the piezoelectric material has a composition given by an expression:

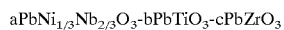

wherein a+b+c=1, and $0<a<0.8$, $0.2<b<1.0$ and $0.2<c<0.8$.

In the above-described piezoelectric device it is preferable that the piezoelectric material has a composition given by an expression:

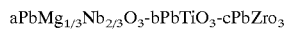

wherein a+b+c=1, and $0<a<0.8$, $0.2<b<1.0$ and $0.2<c<0.8$.

The above-described object is achieved by a piezoelectric device comprising a basic composition given by an expression:

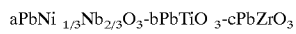

wherein a+b+c=1, and $0.40<a<0.75$, $0.25<b<0.55$ and $0.05<c<0.45$;

$PbHfO_3$ and/or $PbMg_{1/3}Nb_{2/3}O_3$ added by totally 0–3 mol %; and aluminium oxide by below 0.2 mol %.

In the above-described piezoelectric device it is preferable that the piezoelectric device further comprises electrode layers of Ag—Pd paste or Pt paste sandwiching a piezoelectric layer of the piezoelectric material.

In the above-described piezoelectric device it is preferable that the piezoelectric layer and the electrode layers are alternately laid one on another, so that at least two layers of the piezoelectric layer are included.

The above-described object is achieved by a method for fabricating a piezoelectric device comprising: the first step of mixing piezoelectric materials except PbO to produce a first mixture; a second step of pre-sintering the first mixture; a third step of mixing the pre-sintered first mixture and PbO to produce a second mixture; and a fourth step of pre-sintering the second mixture to produce piezoelectric powder, whereby evaporation of the PbO is prevented, and the piezoelectric powder can have a required composition ratio.

In the above-described method for fabricating a piezoelectric device it is preferable that the first step is for mixing MgO, NiO, $Nb_2O_5$, $TiO_2$, $ZrO_2$, and/or $HfO_2$.

In the above-described method for fabricating a piezoelectric device it is preferable that the first step and/or the third step is for conducting the mixing by the use of zirconium balls.

In the above-described method for fabricating a piezoelectric device it is preferable that the first step and/or the third step is for dispersing the raw materials to be mixed in a solvent of acetone to mix the same.

The above-described object is achieved by a method for fabricating a piezoelectric device comprising: a first step of mixing piezoelectric raw materials and pre-sintering a mixture to produce piezoelectric powder; a second step of laying green sheets formed of the piezoelectric powder one on another and pressing to form a laminated body; and a third step of burying the laminated body in a sintering powder of substantially the same composition as the piezoelectric power, whereby generation of pyrochlore phase, which does not contribute to piezoelectric characteristics, is prevented, and the piezoelectric device can be formed of a piezoelectric material having perovskite phase.

In the above-described method for fabricating a piezoelectric device it is preferable that the piezoelectric raw materials include PbO; and the sintering powder used in the step contains more PbO than the piezoelectric powder.

DETAILED DESCRIPTION OF THE INVENTION

[A First Embodiment]

A piezoelectric material of a piezoelectric device according to a first embodiment of the present invention will be explained with reference to FIGS. 1 to 5.

The piezoelectric material of the present embodiment has as a basic structure a perovskite structure of $PbNi_{1/3}Nb_{2/3}O_3$, $PbTiO_3$ and $PbZrO_3$ mixed by required composition ratios, i.e., a perovskite structure expressed by the following expression:

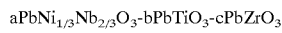

$$aPbNi_{1/3}Nb_{2/3}O_3\text{-}bPbTiO_3\text{-}cPbZrO_3$$

wherein a, b and c represent composition ratios, and a+b+c=1.

By giving suitable values to the composition ratios a, b and c of the perovskite structure, the piezoelectric device can have a large grain diameter and cracks between domains of the grain.

Figure 1A:
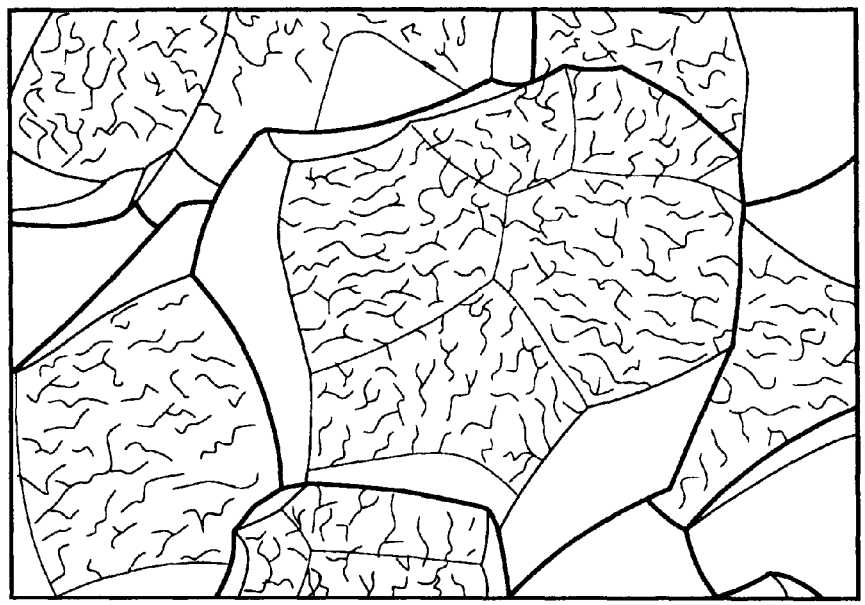
FIGS. 1A and 1B are schematic diagrams of a structure of a piezoelectric material according to a first embodiment of the present invention.
Figure 1B:
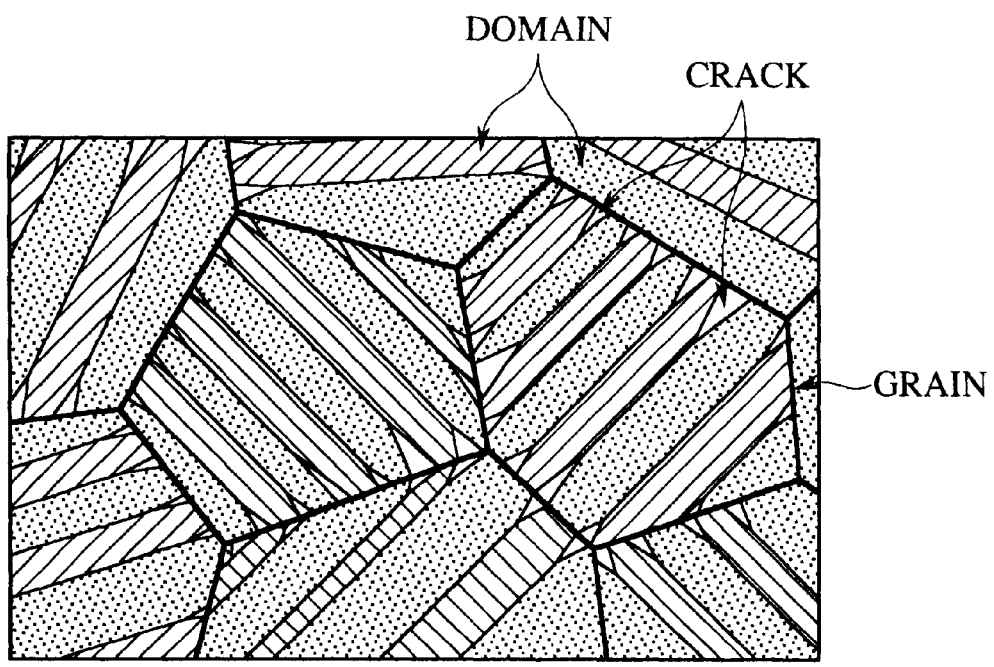

In the crystal structure of a piezoelectric material a number of domains having crystal orientations different from each other cohere to form one grain. A number of grains cohere to form the piezoelectric material. The inventors of the present invention prepared the piezoelectric material of the present embodiment and observed the surface of the piezoelectric material, and found that when a grain has a larger size than a certain size, cracks as shown in FIG. 1A appear on the surfaces of the grain. As shown in a schematic diagram of FIG. 1B, when a number of grains having crystal orientations different from each other cohere to form a grain, the domains become larger, the grain becoming accordingly larger, with a result that the domains cannot cohere perfectly close to each other with the ends thereof separated from each other, and the cracks take place.

In measuring the displacement amount of this piezoelectric material is measured, the displacement amount of this piezoelectric material with cracks is drastically increased in comparison with that of piezoelectric material without cracks. This will be due to the mechanism shown in FIG. 2.

Figure 2A:
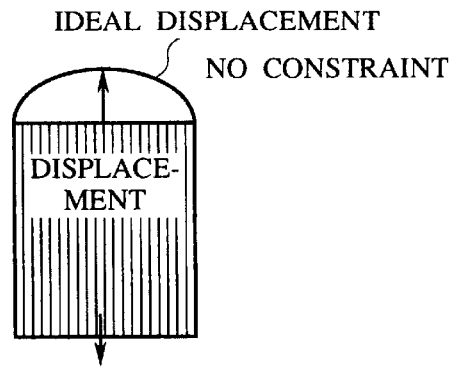
FIGS. 2A–2C are schematic diagrams of displacements of a piezoelectric device according to the first embodiment, which show a mechanism of the displacement thereof.
Figure 2B:
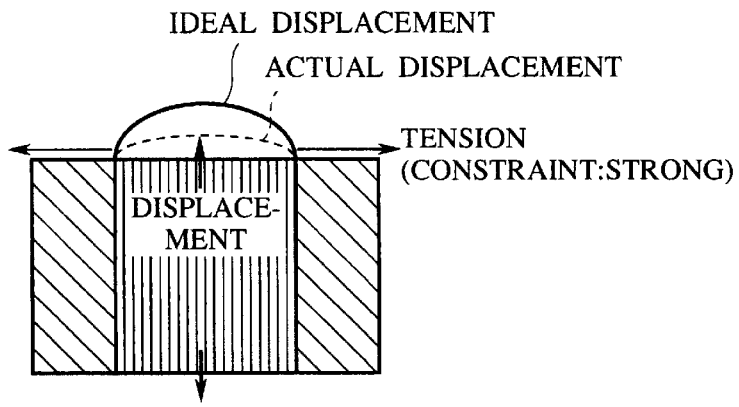
Figure 2C:
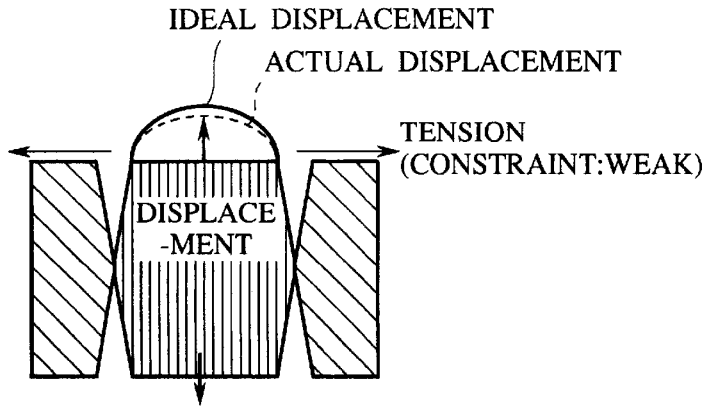

As shown in FIG. 2A, when a voltage is applied to a single crystal piezoelectric element without any external constraint, a displacement of the piezoelectric element is intrinsic or ideal to a piezoelectric material thereof. In a case of a polycrystal piezoelectric material without cracks, however, as shown in FIG. 2B, each grain is strongly constrained by its adjacent grains, and an actual displacement is much smaller than an ideal displacement of the piezoelectric material. In a case that cracks are present among grains as in the present embodiment, as shown in FIG. 2C, a constraining force exerted to each grain from its adjacent grains is weak, and a displacement which is substantially the same as an ideal displacement of the piezoelectric material can be actually obtained.

Figure 3:
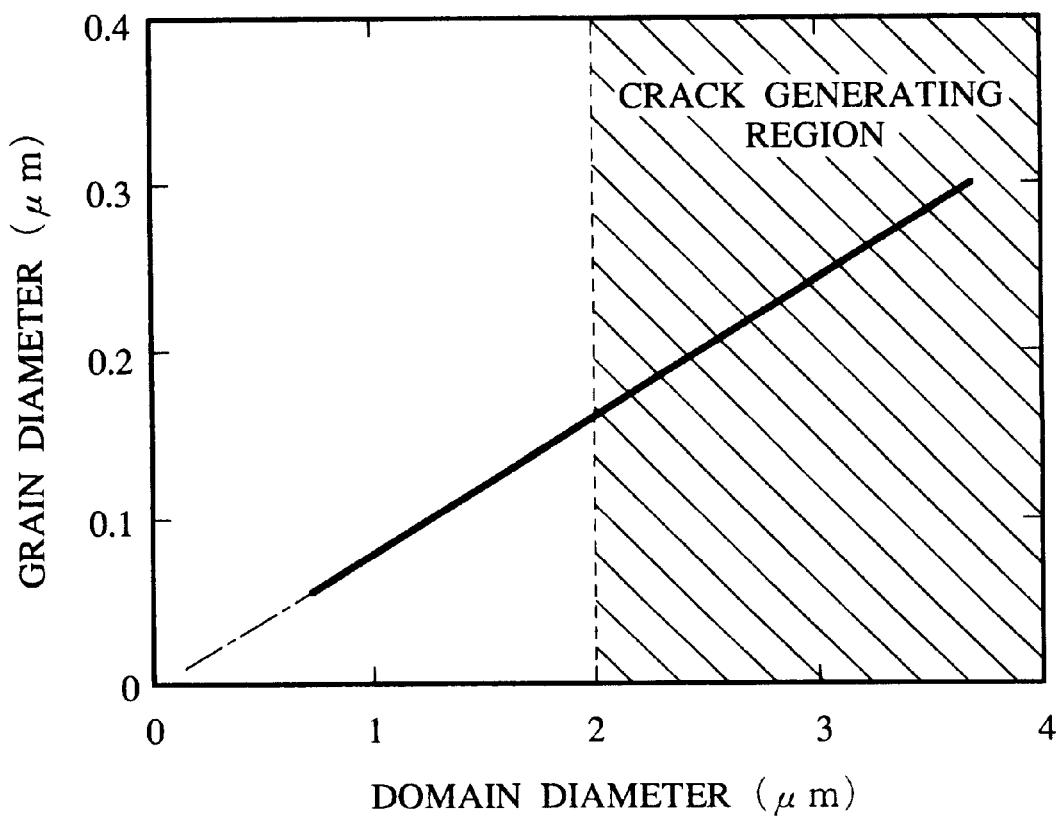
FIG. 3 is a graph showing a range of diameters of a grain of the piezoelectric material according to the first embodiment of the present invention, in which cracks take place.

Thus, it is important for a piezoelectric material that the piezoelectric material has a crystal structure which produces cracks. Piezoelectric materials of different composition ratios from each other were prepared to check presence of cracks, and it was found that cracks take place as grains have larger grain diameters. FIG. 3 shows a range where cracks are generated, and relationships between average grain diameters of grains and average domain diameters. As shown in FIG. 3, it was found that when an average diameter of grains is above about 2 μm, cracks are produced in most grains. An average domain diameter at this time was above about 0.15 μm.

Figure 4:
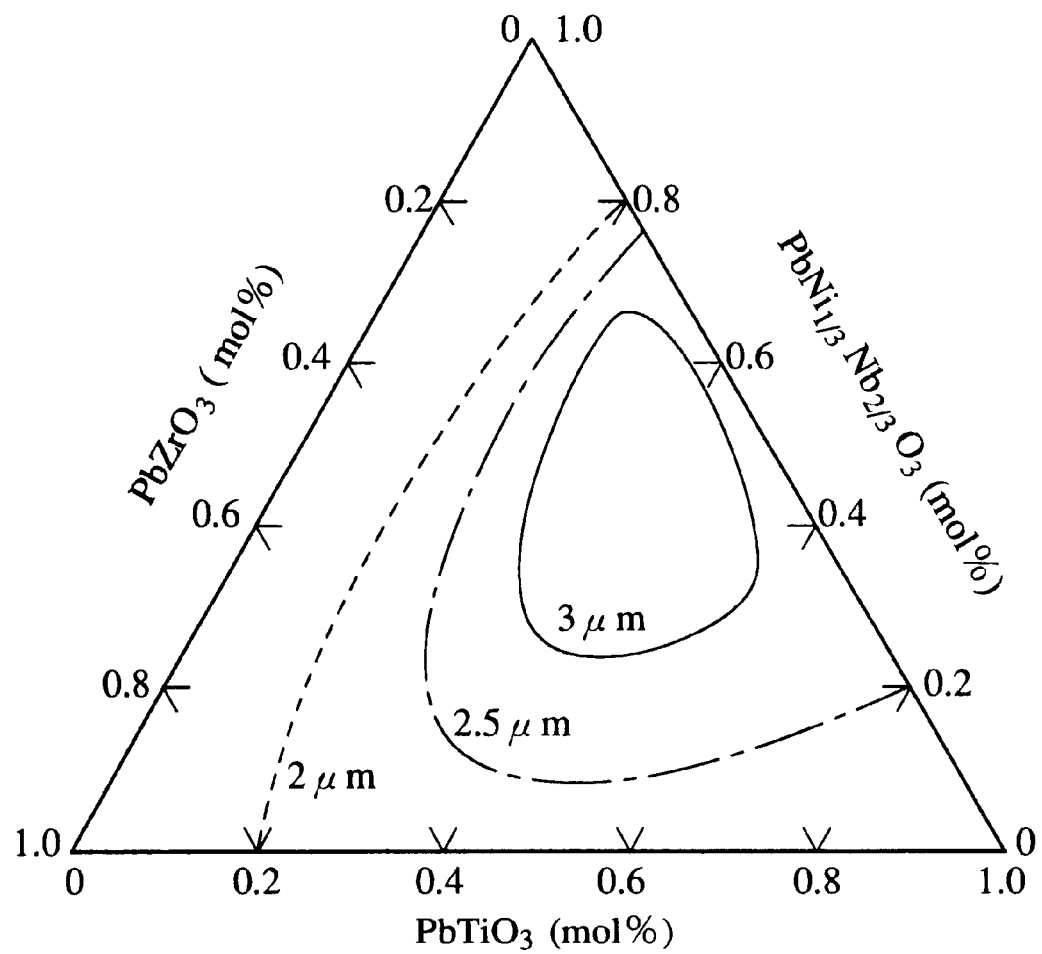
FIG. 4 is a graph of a grain diameter distribution of the piezoelectric material of the first embodiment of the present invention.

Composition ratios a, b and c of the piezoelectric material of the present embodiment were changed, and it was found that the relationships shown in FIG. 4 are present between the compositions ratios a, b and c and average grain diameters of the grains. That is, a region where an average grain diameter is above 2 μm, a region where an average grain diameter is above 2.5 μm, and a region where an average grain diameter is above 3 μm are present corresponding to composition ratios a, b and c.

Figure 5:
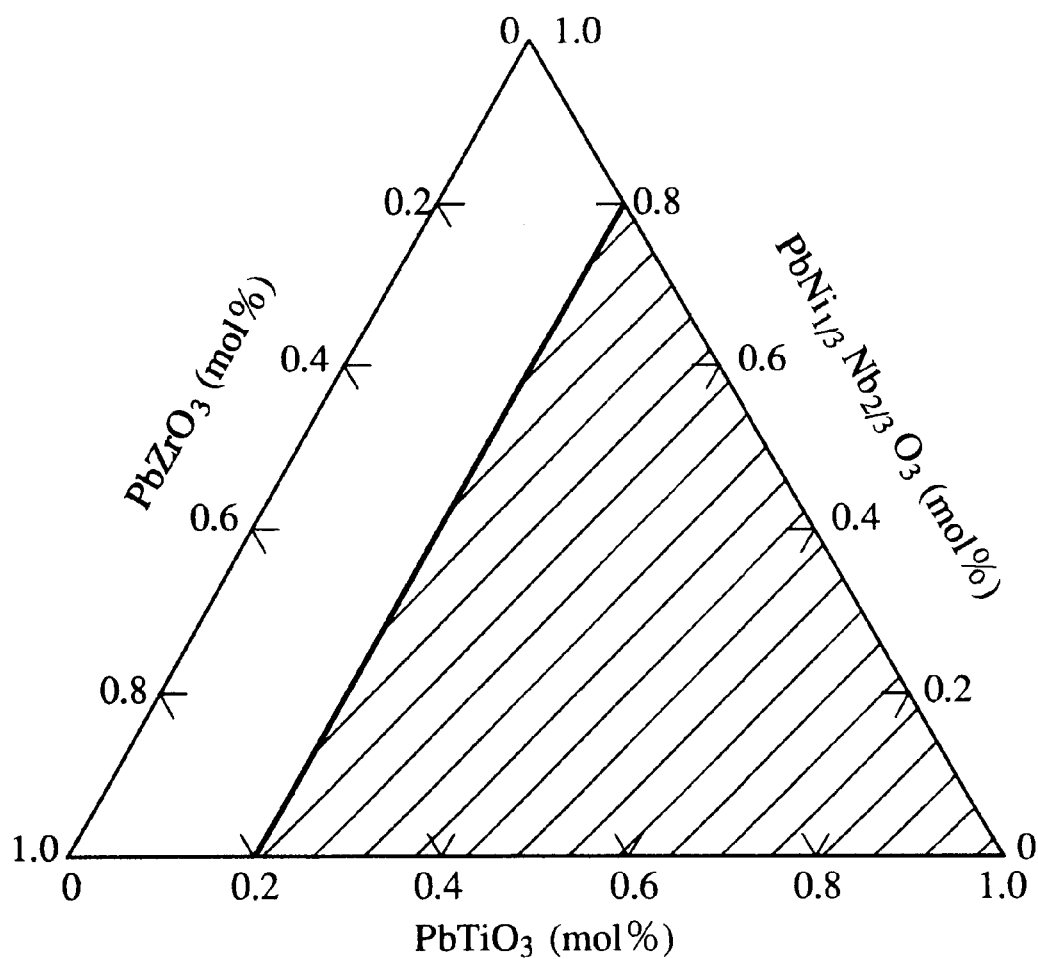
FIG. 5 is a graph of composition ranges of the piezoelectric material of the first embodiment of the present invention.

As shown in FIG. 3, when a grain diameter is above about 2 μm, cracks take place among domains, and the piezoelectric material of the present embodiment has composition ratios in the range shown in FIG. 5, i.e., a composition expressed by the following expression:

$$aPbNi_{1/3}Nb_{2/3}O_3\text{-}bPbTiO_3\text{-}cPbZrO_3$$

wherein a+b+c=1, and 0<a<0.8, 0.2<b<1.0 and 0.2<c<0.8 so that the piezoelectric device can have piezoelectric characteristics of high achievement having a large displacement.

[A Second Embodiment]

A piezoelectric material of the piezoelectric device according to a second embodiment of the present invention will be explained with reference to FIGS. 6 and 7.

A piezoelectric material of the present embodiment is $PbMg_{1/3}Nb_{2/3}O_3$ in place of $PbNi_{1/3}Nb_{2/3}O_3$ and has a perovskite structure of $PbTiO_3$ and $PbZrO_3$ mixed with each other by set ratios, i.e., a perovskite structure expressed by the following expression:

$$aPbMg_{1/3}Nb_{2/3}O_3\text{-}bPbTiO_3\text{-}cPbZrO_3$$

wherein a, b and c represent composition ratios, and a+b+c=1.

By giving suitable values to the composition ratios a, b and c of the perovskite structure, the piezoelectric device can have large grain diameters and cracks between domains of grains.

Figure 6:
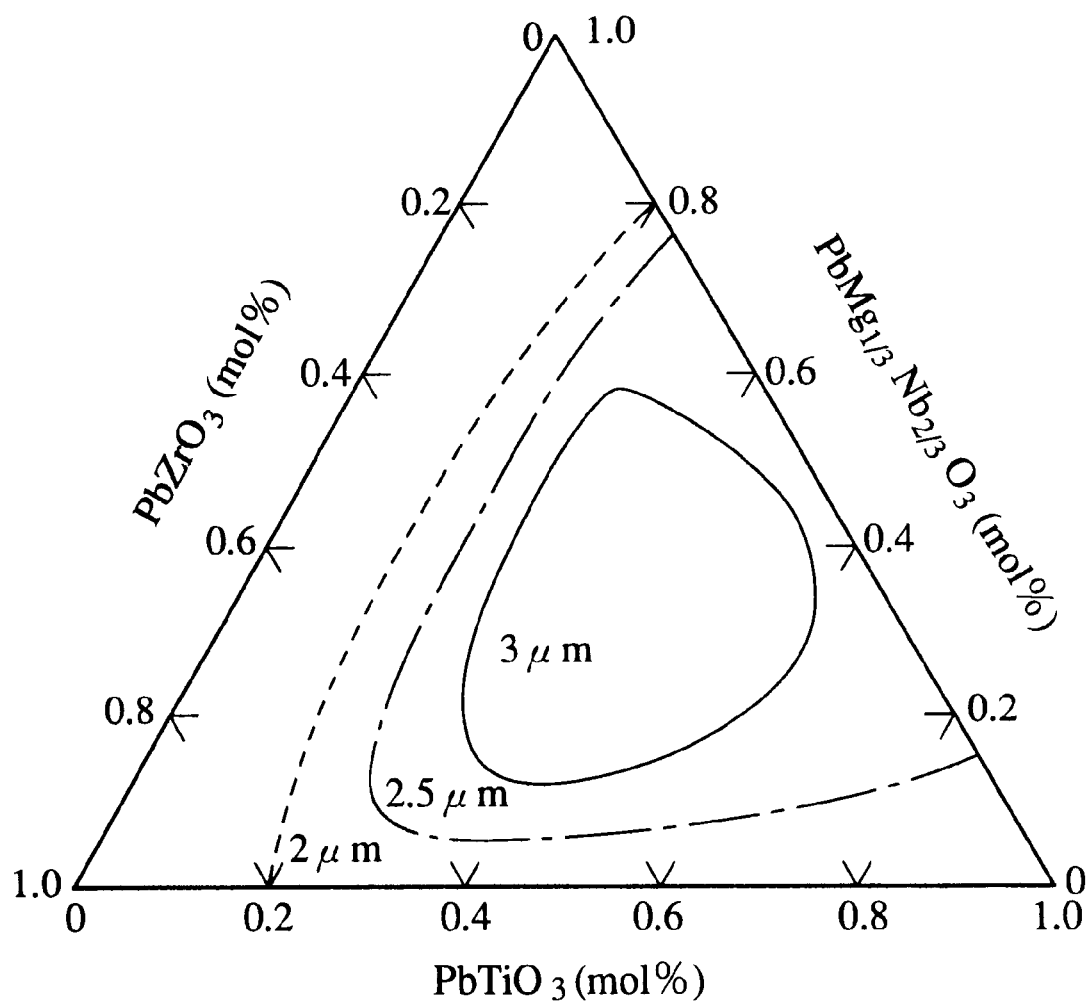
FIG. 6 is a graph of a grain diameter distribution of the piezoelectric material of the first embodiment of the present invention.

In the piezoelectric material of the present embodiment, composition ratios a, b and c were changed, and it was found that the composition ratios a, b and c and average grain diameters have relationships with each other which are shown in FIG. 6. That is, a region where an average grain diameter is above 2 μm, a region where an average grain diameter is above 2.5 μm and a region where an average grain diameter is above 3 μm are present corresponding to composition ratios a, b and c.

Figure 7:
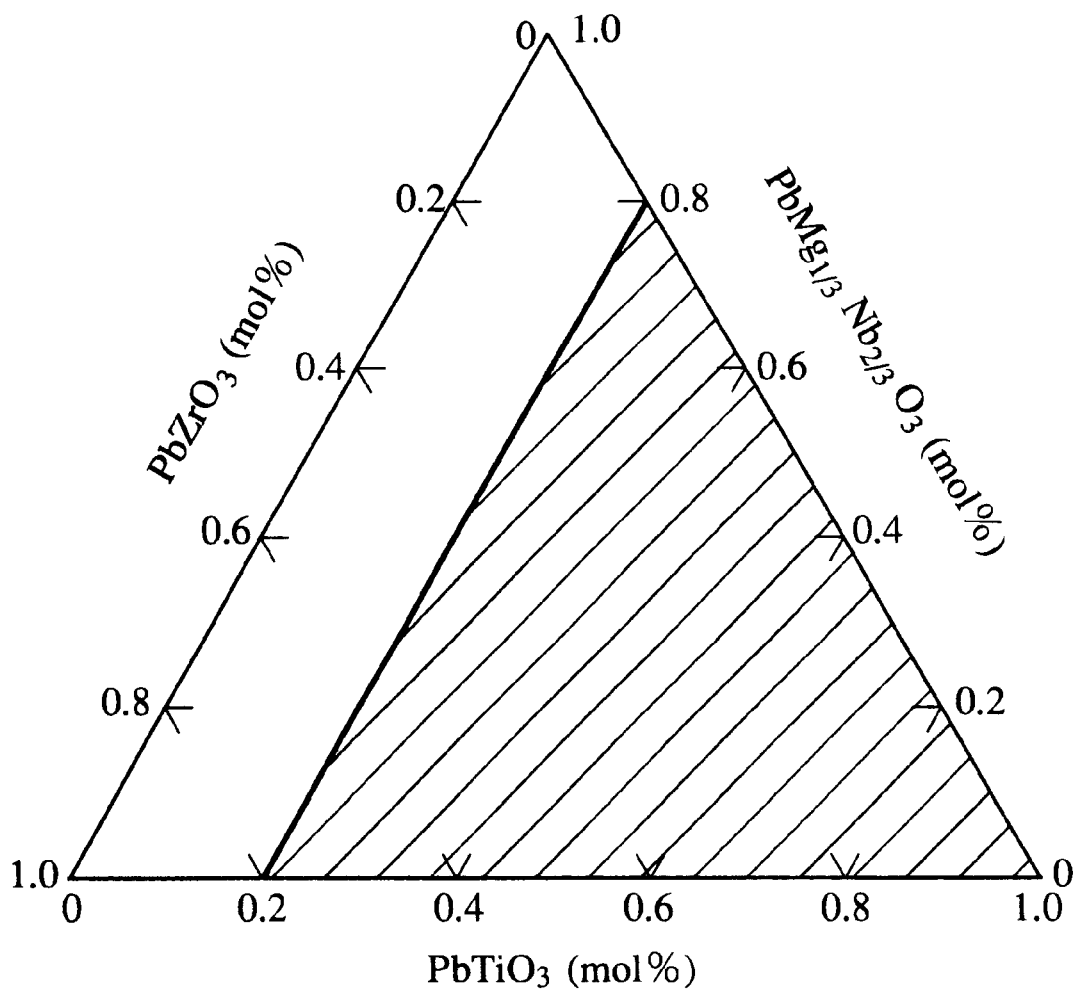
FIG. 7 is a graph of composition ranges of the piezoelectric material of a second embodiment of the present invention.

As shown in FIG. 3, when a grain has a diameter of above about 2 μm, cracks occur among domains, and the piezoelectric material of the present embodiment has composition ratios in the range shown in FIG. 7, i.e., a composition given by the following expression:

$$aPbMg_{1/3}Nb_{2/3}O_3\text{-}bPbTiO_3\text{-}cPbZrO_3$$

wherein a+b+c=1 and 0<a<0.8, 0.2<b<1.0 and 0.2<c<0.8 so that the piezoelectric device can have piezoelectric characteristics of high achievement having a large displacement.

[A Third Embodiment]

A piezoelectric material of the piezoelectric device according to a third embodiment of the present invention will be explained with reference to FIGS. 8 and 9.

The piezoelectric material of the present embodiment has as a basic structure a perovskite structure of $PbNi_{1/3}Nb_{2/3}O_3$, $PbTiO_3$ and $PbZrO_3$ mixed by required composition ratios, i.e., a perovskite structure expressed by the following expression:

$$aPbNi_{1/3}Nb_{2/3}O_3\text{-}bPbTiO_3\text{-}cPbZrO_3$$

wherein a, b and c represent composition ratios, and a+b+c=1

The piezoelectric material contains $PbHfO_3$ and/or $PbMg_{1/3}Nb_{2/3}O_3$ totally by 0–3 mol %, and aluminium oxide by below 0.2 mol % which is less than the conventional piezoelectric materials.

By giving suitable values to the composition ratios a, b and c of the piezoelectric material of the present embodiment, the piezoelectric material can have an electromechanical coupling coefficient $k_{33}$ of above 70% which has not been conventionally realized.

Figure 8:
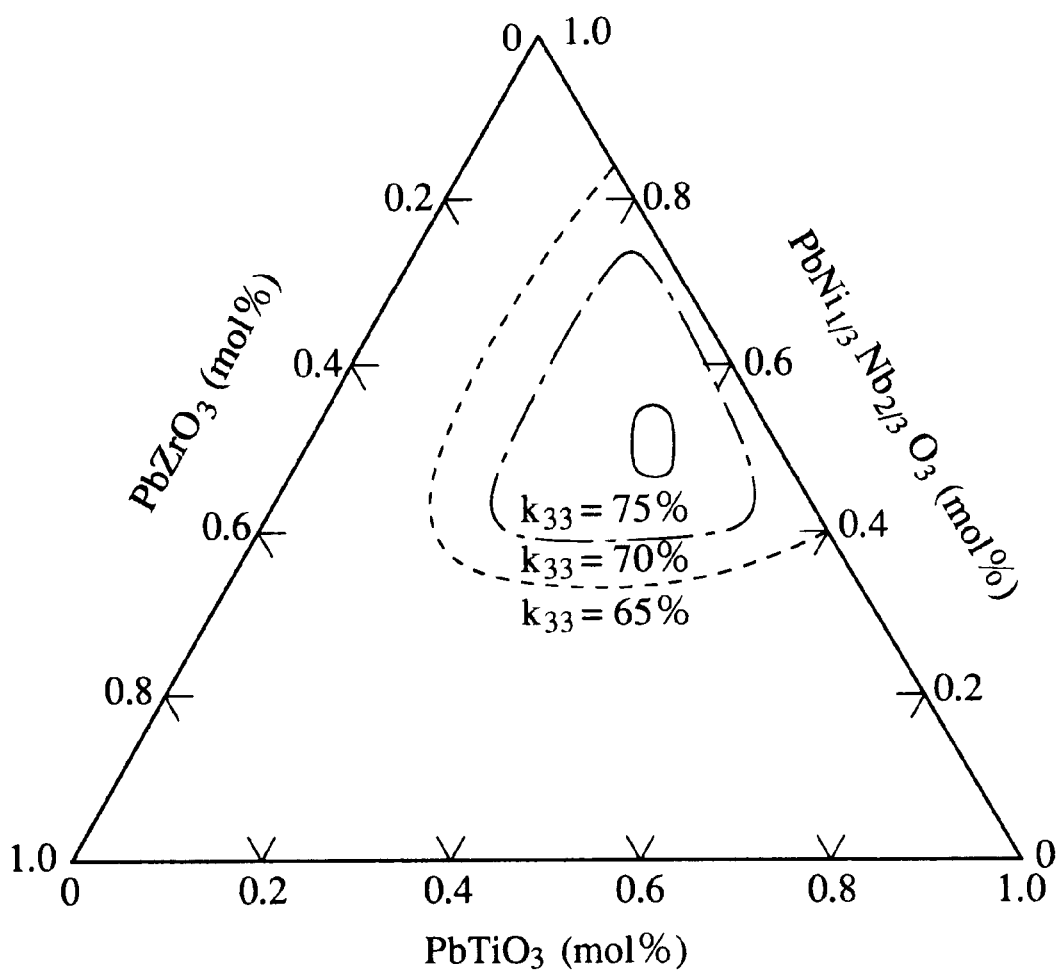
FIG. 8 is a graph of an electromechanical coupling coefficient $k_{33}$ of a piezoelectric material of the third embodiment of the present invention.

When composition ratios a, b and c of the piezoelectric material of the present embodiment were changed, it was found that the relationships shown in FIG. 8 are present between the compositions ratios a, b and c and electromechanical coupling coefficients $k_{33}$. That is, a region where an electromechanical coupling coefficient $k_{33}$ is above 65%, a region where an electromechanical coupling coefficient $k_{33}$ is above 70%, and a region where an electromechanical coupling coefficient $k_{33}$ is above 75% are present corresponding to composition ratios a, b and c.

Figure 9:
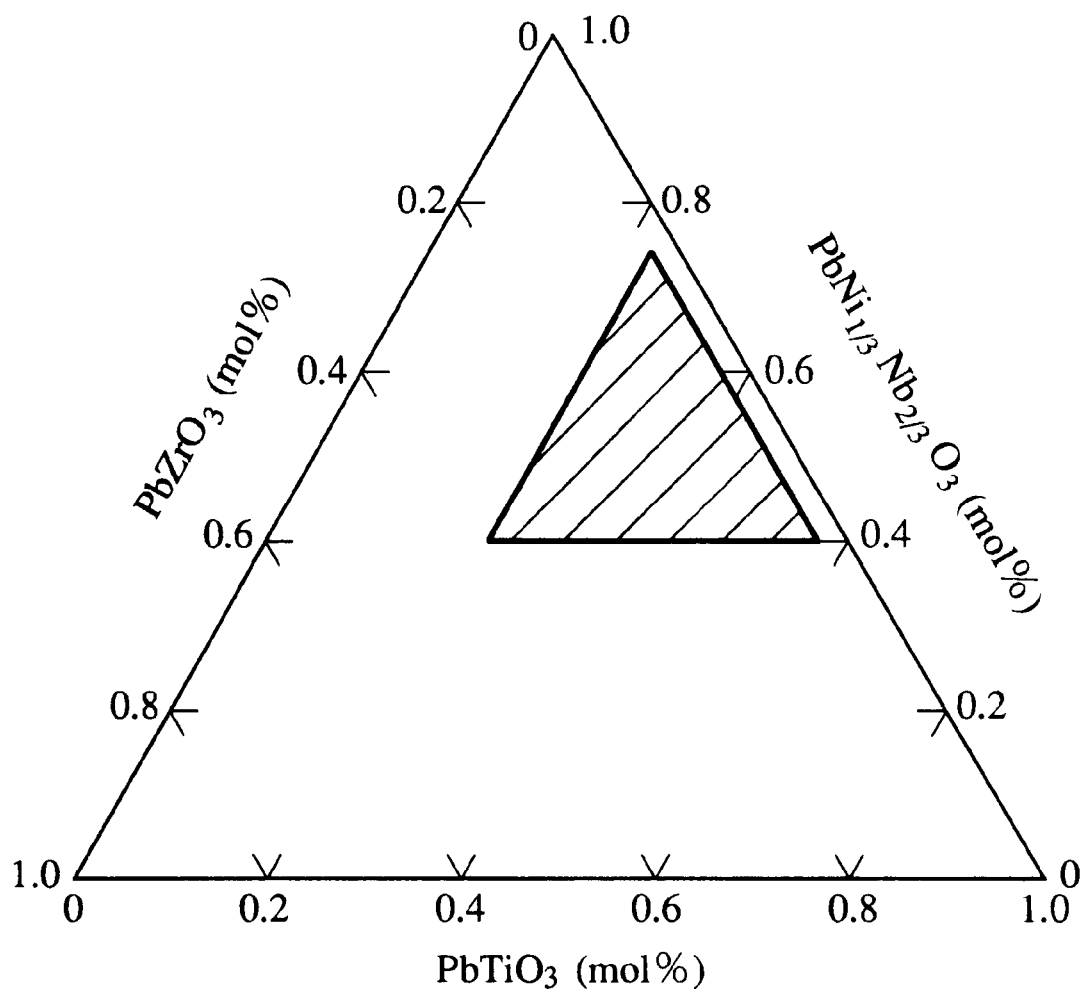
FIG. 9 is a graph of composition ranges of the piezoelectric material of the third embodiment of the present invention.

The piezoelectric material of the present embodiment has composition ratios in the range shown in FIG. 9, i.e., a composition expressed by the following expression:

$$aPbN_{1/3}Nb_{2/3}O_3\text{-}bPbTiO_3\text{-}cPbZrO_3$$

wherein a+b+c=1, and 0.40<a<0.75, 0.25<b<0.55 and 0.05<c<0.45 so that the piezoelectric device can have piezoelectric characteristics of high achievement having a large displacement.

The piezoelectric material of the composition especially given by the following expression:

$$0.5PbNi_{1/3}Nb_{2/3}O_3\text{-}0.345PbTiO_3\text{-}0.155PbZrO_3$$

had a 80.8% electromechanical coupling coefficient $k_{33}$ and a 948 pm/V piezoelectric constant.

[Method for Fabricating the Piezoelectric Device]

The piezoelectric device fabricating method according to one embodiment will be explained with reference to FIGS. 10 to 12. In the present embodiment the piezoelectric device according to the first to the third embodiments, which have been explained above.

First, impurities contained in PbO, MgO, NiO, $Nb_2O_3$, $TiO_2$, $ZrO_2$ and $HfO_2$, which are raw materials are completely removed. Specifically, impurities are removed so that Bi is below 7000 ppm exclusive of 7000 ppm, Zn is below 5000 ppm exclusive of 5000 ppm, Fe if below 6000 ppm exclusive of 6000 ppm, Co is below 2000 ppm exclusive of 2000 ppm, Al is below 4000 ppm exclusive of 4000 ppm, Cu is below 12000 ppm exclusive of 12000 ppm, Ca is below 2000 ppm exclusive of 2000 ppm, and other elements are below 100 ppm exclusive of 100 ppm.

Figure 10:
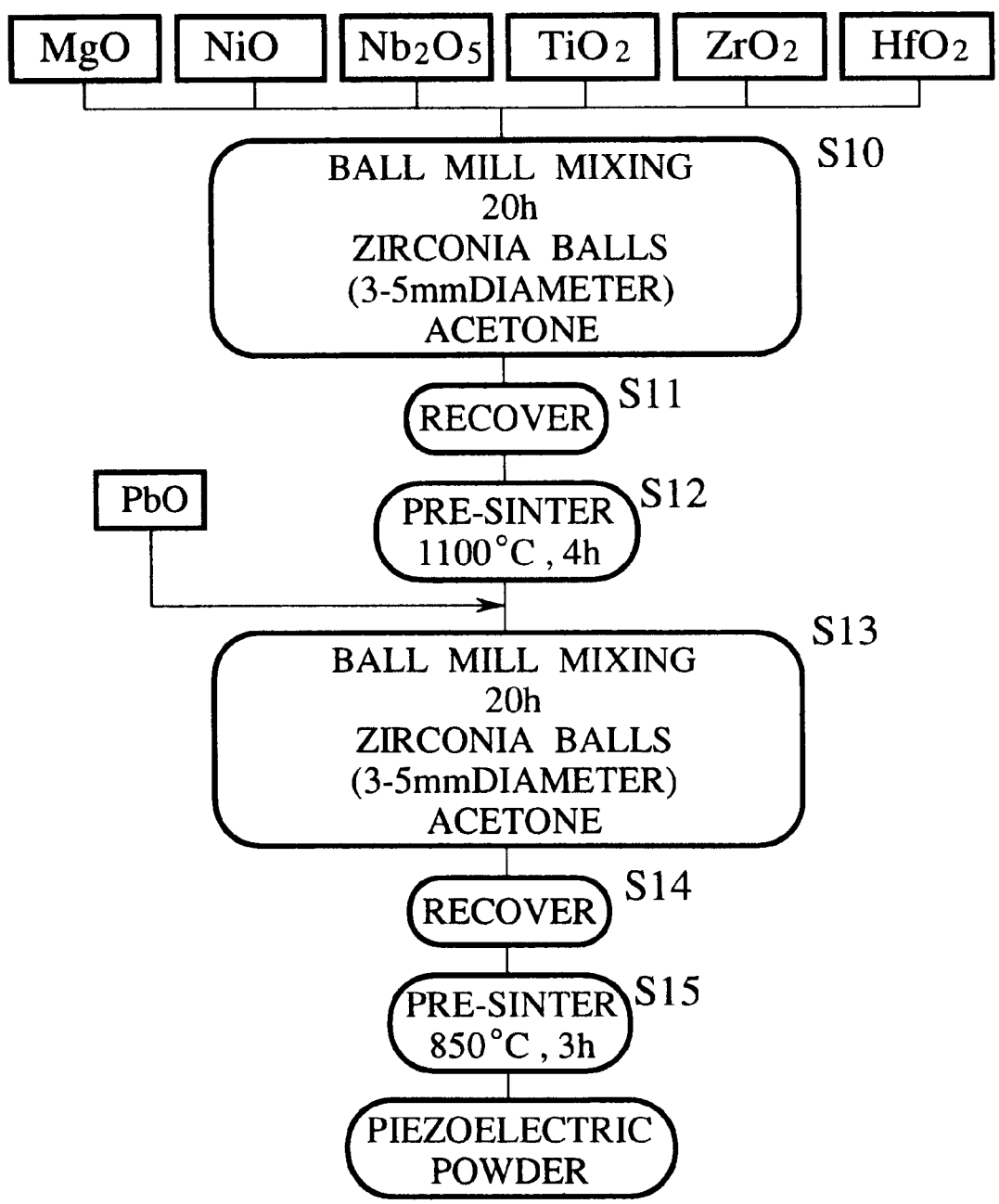
FIG. 10 is views of the piezoelectric device according to one embodiment of the present invention in the steps of the method for fabricating the piezoelectric device, which show the method (Part 1).

Then, as shown in FIG. 10, required amounts of the raw materials MgO, NiO, $Nb_2O_3$, $TiO_2$, $ZrO_2$ and $HfO_2$ except PbO are precisely measured, and milled and mixed homogeneous for about 20 hours with acetone as a solvent in a ball mill with zirconia balls of an about 5 mm diameter loaded in (Step S10).

Figure 11:
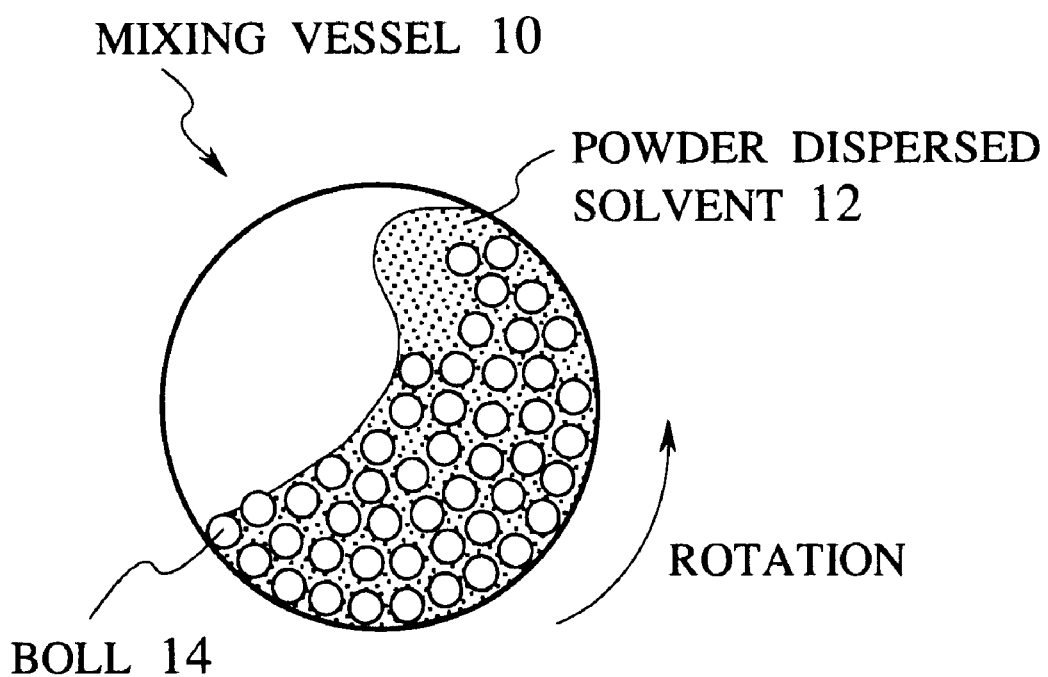
FIG. 11 is a view of ball mill mixing used in the method for fabricating the piezoelectric device according to one embodiment of the present invention.
Figure 12:
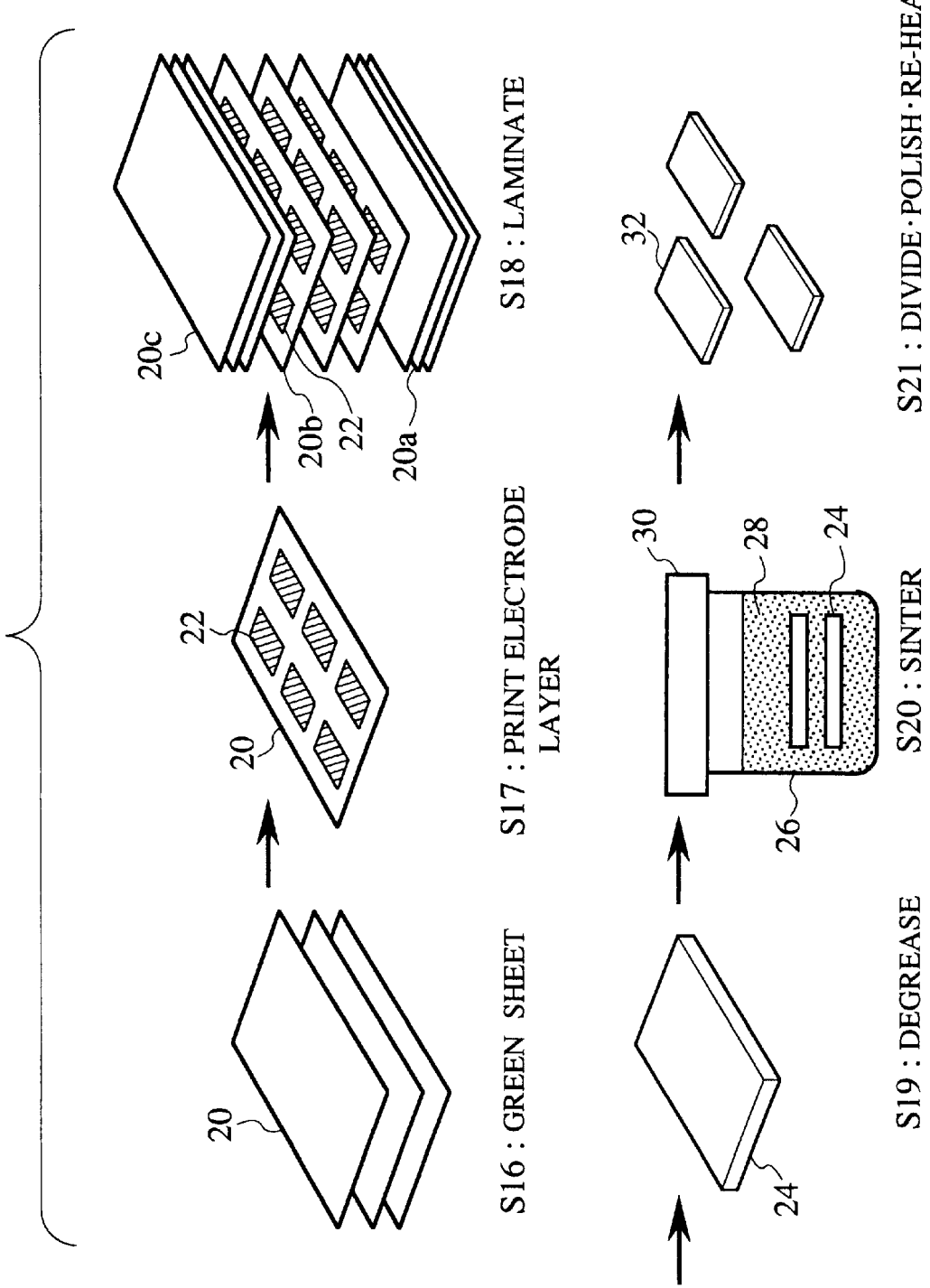
FIG. 12 is views of the piezoelectric device according to one embodiment of the present invention in the steps of the method for fabricating the piezoelectric device, which show the method (Part 2).

The ball mill mixture is a treatment in which, as shown in FIG. 11, a raw material 12 of raw material powders dispersed in an acetone solvent is loaded in a cylindrical mixing vessel 10 together with zirconia balls 14, and the mixing vessel 10 is rotated to mix the raw material 12. In the present embodiment, the balls 14 are made of zirconia, and the balls which are abraded and mixed in the raw material are not an impurity. The zirconia balls may be replaced by metal balls coated with plastics.

Next, the dispersed solution is separated from the balls and dried in a hot bath for 8 hours, and a powder mixture is recovered (Step S11). In the present embodiment, the solvent is provided by acetone, and can be dried and evaporated in a short time. Accordingly, as are in the conventional method using water or alcohol as a solvent, the powders which have been mixed with each other are never separated from each other by sedimentation, and additionally the powder mixture can be recovered in a short time.

Then, a pre-sintering is conducted at 1100° C. for about 4 hours (Step S12).

Then, a precisely measured amount of PbO is added to the powder mixture having homogeneity improved by reaction by the pre-sintering, and the powder mixture is milled and mixed homogeneous for about 20 hours by the use of acetone as a solvent in a ball mill with zirconia balls of an about 5 mm-diameter loaded in (Step S13).

Then, the dispersed solution is separated from the balls and dried for 8 hours in a hot bath, and the powder mixture is recovered (Step S14).

Next, the powder mixture is pre-sintered at 850° C. for about 3 hours and is caused to is reacted (Step S15). Resultantly, a piezoelectric powder $PbNi_{1/3}Nb_{2/3}O_3$—$PbMg_{1/3}Nb_{2/3}O_3$—$PbTiO_3$—$PbZrO_3$—$PbHfO_3$ having composition ratios corresponding to the mixed amounts is completed.

Then, the piezoelectric powder, an organic binder (PVB: poly vinyl butyral), a plasticizer (DBP: dibutyl phthalate) and an organic solvent (ethanol) are mixed in a ball mill to form slurry.

Then, the slurry is formed by the doctor blade into a 50 μm-thickness piezoelectric green sheet 20. The green sheet 20 is pressed into about 100 mm-square pieces (Step S16).

Then, an electrode layer 22 of Ag—Pd paste or Pt paste is screen-printed on some of the green sheet 20 pieces (Step S17).

Next, 30 sheets of the green sheet pieces 20a without the electrode layer 22 printed are laid one on another, 4 sheets of the green sheet pieces 20b with the electrode 22 printed on are laid on the top of the laminated green sheet pieces 20a, and 8 green sheet pieces 20c without the electrode layer printed on are laid one on another on the top of the laminated green sheet pieces 20b, and then the whole is pressed by a uniaxial press at 80° C. and a 50 MPa and integrated into a laminated body 24 (Step S18).

Then, the laminated body 24 is degreased in an electric furnace for about 4 hours in 500° C. atmospheric air (Step S19).

Next, an piezoelectric powder 28 of the same composition as the piezoelectric material is loaded in a high-purity alumina ceramics 26, then the degreased laminated body 24 is buried therein, and the high-purity alumina ceramics 26 is closed by a cap 30 to be sintered in an electric furnace for about 3 hours at 1100° C. (Step S20). It is possible that the piezoelectric powder 28, in which the laminated body is buried in, may contain a little excessive amount of PbO. A steam pressure of the PbO in the sintering is controlled, whereby the piezoelectric material can have sufficiently grown grains.

Finally, the die body of the sintered laminated body 24 is cut off, and individual piezoelectric device 32 are completed (Step S21).

In the method for fabricating the piezoelectric device according to the present embodiment, the piezoelectric device can include perovskite phase by above 99% with production of pyrochlore phase suppressed, and have piezoelectric characteristics of high achievement.

By the laminated body 24 is sintered in a powder of substantially the same composition as the piezoelectric material especially in Step S20 of the sintering, production of phyrochlore phase can be effectively suppressed.

Figure 13:
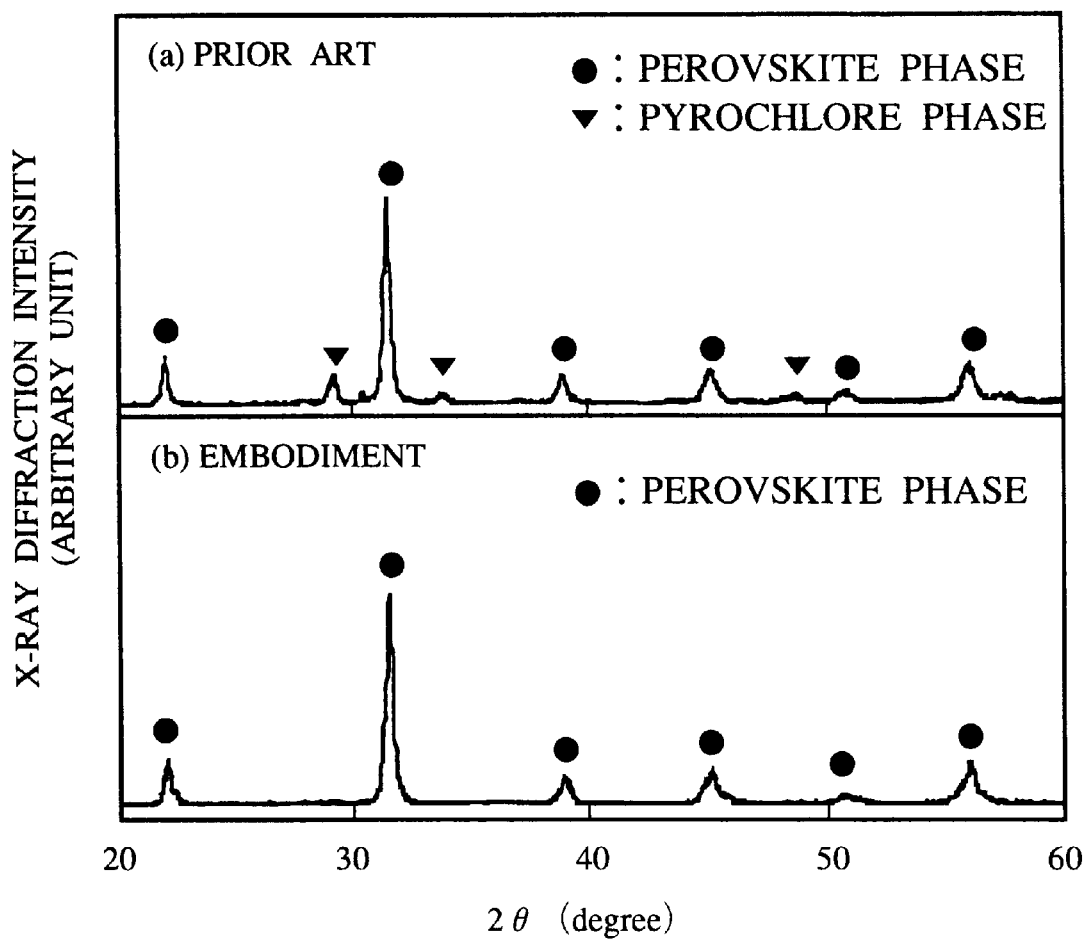
FIG. 13 is a graph of results of x-ray diffraction of a piezoelectric material sintered by the method for fabricating the piezoelectric device according to the embodiment of the present invention and a piezoelectric material sintered by the conventional method, which compares both in x-ray diffraction.

FIG. 13 compares compositions of a piezoelectric material between the case where the laminated body 24 is sintered in the atmosphere and the case where the laminated body 24 is sintered in a powder of the same composition as the piezoelectric material. The piezoelectric material involved in FIG. 13 has a composition expressed by $aPbNi_{1/3}Nb_{2/3}O_3$-$bPbTiO_3$-$dPbZrO_3$ .

FIG. 13A shows a result of X-diffraction of the piezoelectric material sintered in the atmosphere. FIG. 13B is a result of X-ray diffraction of the piezoelectric material sintered in a powder of the same composition as the piezoelectric material. In FIG. 13A, peaks of perovskite phase (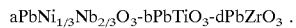and peaks of pyrochlore phase (▼) are both found, but in FIG. 13B peaks of perovskite phase (● alone are found. The composition of the pyrochlore phase is $Pb_{1.86}Ni_{0.24}Nb_{1.76}O_{6.5}$.

Figure 14:
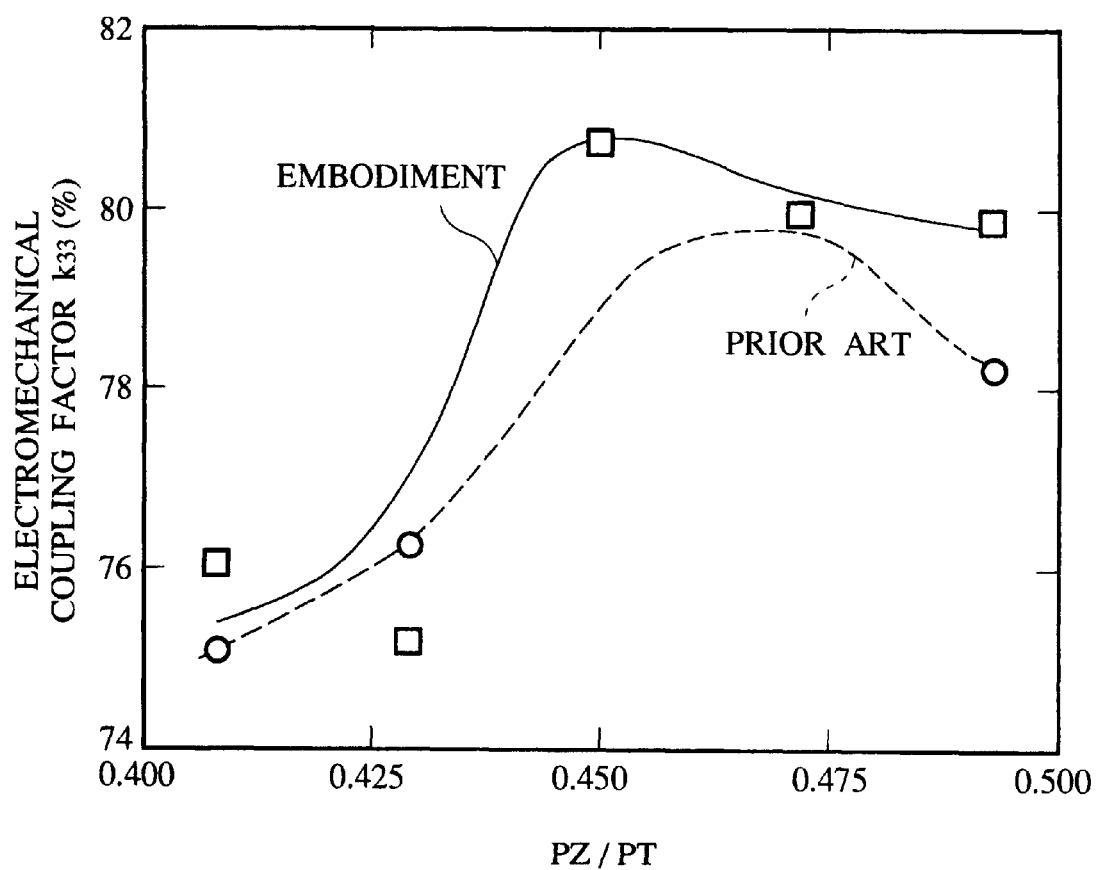
FIG. 14 is a graph of electromechanical coupling coefficient $k_{33}$ of a piezoelectric material sintered by the method for fabricating the piezoelectric device according to the embodiment of the present invention and a piezoelectric material sintered by the conventional method, which compares both in electromechanical coupling coefficient $k_{33}$.

FIG. 14 compares electromechanical coupling coefficients $k_{33}$ of the piezoelectric material in the case where the laminated body is sintered in the atmosphere and in the case that the laminated body is sintered in a sintering powder of the same composition as the piezoelectric material. The cases where the laminated body is sintered in the atmosphere and where the laminated body is sintered in the sintering powder, both with various mol ratios PZ/PT between mol numbers of $PbTiO_3$ and of $PbZrO_3$ are respectively indicated by the broken line and the solid line. As apparent in FIG. 14, the piezoelectric material can have generally larger electromechanical coupling coefficients $k_{33}$ in the case of sintering in the sintering powder of the same composition, and, especially at a mol ratio PZ/PT of 0.45, can have an electromechanical coupling coefficient $k_{33}$ as high as 80.8%.

[Example]

By the fabrication method according to the above-described embodiment a piezoelectric device of the piezoelectric material having the basic composition expressed by $0.5PbNi_{1/3}Nb_{2/3}O_3$-$0.345PbTiO_3$-$0.155PbZrO_3$ and having $PbHfO_3$ by 0.12 mol % and $PbMg_{1/3}Nb_{2/3}$ by 0.01 mol % added, and containing aluminium oxide by 0.06 mol % was fabricated.

Figure 15:
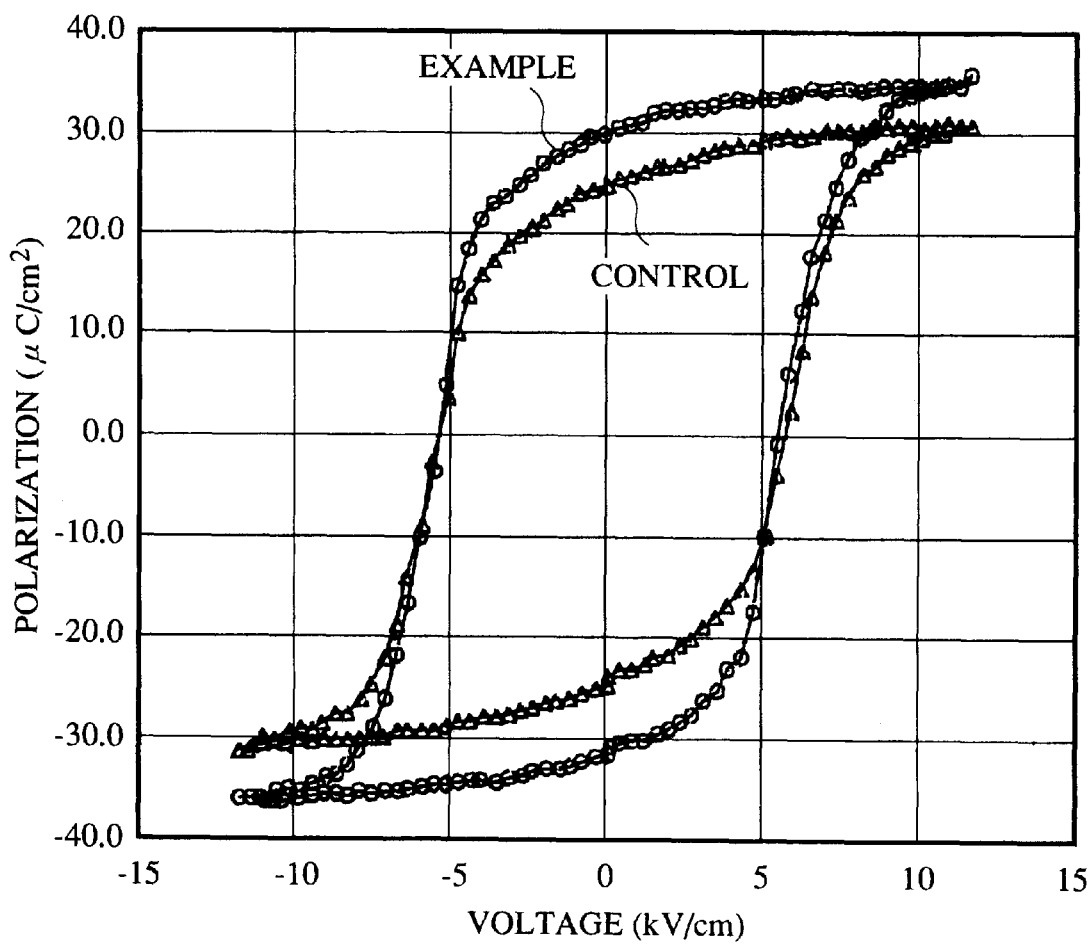
FIG. 15 is a graph of hysteresis curves of polarization with respect to voltages of an example and a control.

The piezoelectric device of the example had a 80.8% electromechanical coupling coefficient $k_{33}$ and a 948 pm/V piezoelectric constant which is a ratio of displacement occurring when applying a voltage to the piezoelectric material. FIG. 15 shows a hysteresis curve of polarization P ($\mu C/cm^2$) with respect to applied voltages E (kV/cm).

Figure 16:
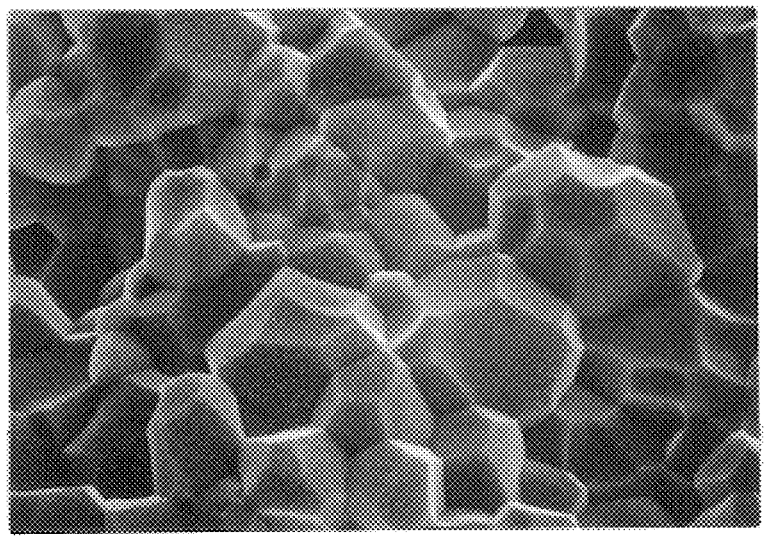
FIG. 16 is a microphotograph of the piezoelectric material of the example.
Figure 17:
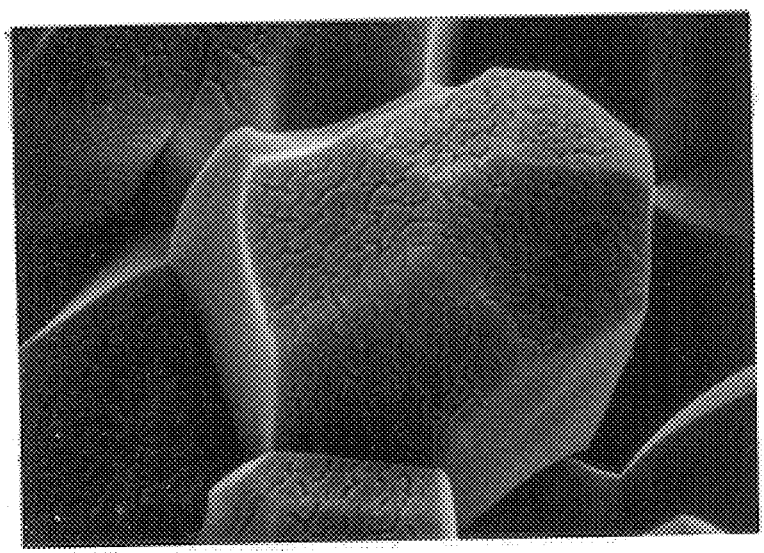
FIG. 17 is an enlarged photograph of the microphotograph of the piezoelectric material of the example.

FIGS. 16 and 17 show microphotographs of the piezoelectric material of the example. FIG. 17 is an enlarged photograph of FIG. 16. FIG. 1 is a diagrammatic view of the enlarged photograph shown in FIG. 17. It is found that the grains have large diameters, and cracks are present in the surfaces of the grains.

[Control]

By the conventional fabrication method a piezoelectric device of a piezoelectric material having the same composition as the above-described example that has the basic composition expressed by $0.5PbNi_{1/3}Nb_{2/3}O_3$-

0.345PbTiO$_3$-0.155PbZrO$_3$ and has PbHfO$_3$ by 0.12 mol % and PbMg$_{1/3}$Nb$_{2/3}$ by 0.01 mol % added, and contains aluminium oxide by 0.06 mol % was fabricated. That is, in the flow chart of FIG. 10 with Steps S10 to S12 omitted, all the raw materials including PbO are mixed at once with water as a solvent in Step S13, are recovered (Step P14) and was pre-sintered (Step S15). The sintering was conducted in air in Step S20 of the flow chart of FIG. 12.

The piezoelectric device of the Control had a 69.5% electromechanical coupling coefficient $k_{33}$ and a 656 pm/V piezoelectric constant. FIG. 15 shows a hysteresis curve of polarization P ($\mu$C/cm$_2$) with respect to applied voltages E (kV/cm).

Figure 18:
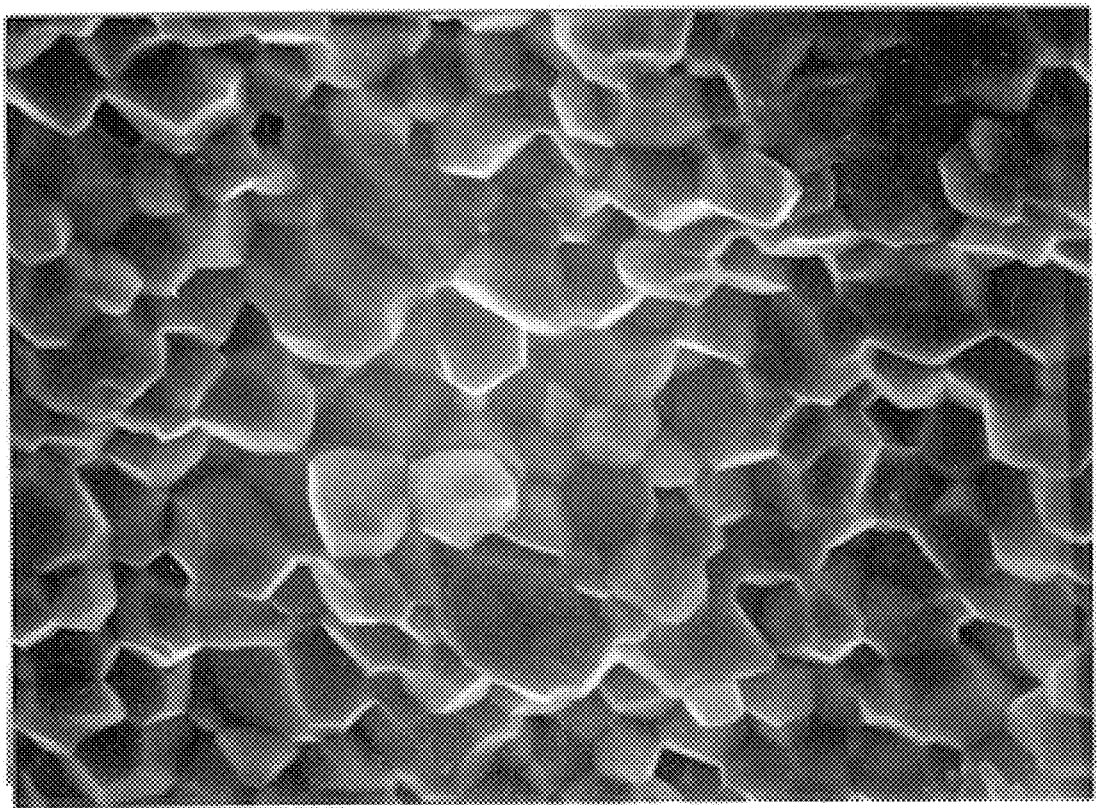
FIG. 18 is a microphotograph of the piezoelectric material of the control.

FIG. 18 shows microphotographs of the Example. It is found that the grain diameters in FIG. 18 are smaller than those of the Example shown in FIG. 16.

What is claimed is:

1. A piezoelectric device of a piezoelectric material including a grain having a plurality of cohering domains, the grain having an average grain diameter of about 2 $\mu$m or more;

the domain having an average diameter of about 0.1 $\mu$m or more; and cracks being formed between the domains.

2. A piezoelectric device according to claim 1, wherein the piezoelectric material having a perovskite structure.

3. A piezoelectric device according to claim 1, wherein the piezoelectric material has a composition given by an expression:

aPbNi$_{1/3}$Nb$_{2/3}$O$_3$-bPbTiO$_3$-cPbZrO$_3$ wherein a+b+c=1, and $0<a<0.8$, $0.2<b<1.0$ and $0.2<c0.8$ .

4. A piezoelectric device according to claim 2, wherein the piezoelectric material has a composition given by an expression:

aPbMg$_{1/3}$Nb$_{2/3}$O$_3$-bPbTiO$_3$-cPbZrO$_3$ wherein a+b+c=1, and $0<a<0.8$, $0.2<b<1.0$ and $0.2<c<0.8$ .

5. A piezoelectric device comprising a basic composition given by an expression:

aPbNi$_{1/3}$Nb$_{2/3}$-bPbTiO$_3$-cPbZrO$_3$ wherein a+b+c=1, and $0.40<a<0.75$, $0.25<b<0.55$ and $0.05<c<0.45$ ;

PbHfO$_3$ and/or PbMg$_{1/3}$Nb$_{2/3}$O$_3$ added by totally 0–3 mol %; and aluminium oxide by below 0.2 mol %.

6. A piezoelectric device according to claim 1, further comprising electrode layers of Ag-Pd paste or Pt paste sandwiching a piezoelectric layer of the piezoelectric material.

7. A piezoelectric device according to claim 6, wherein the piezoelectric layer and the electrode layers are alternately laid one on another, so that at least two layers of the piezoelectric layer are included.

8. An ink jet printer head comprising a piezoelectric device of a piezoelectric material including a grain having a plurality of cohering domains, the grain having an average grain diameter of about 2 $\mu$m or more; the domain having an average diameter of about 0.1 $\mu$m or more; and cracks being formed between the domains.

* * * * *